(12) United States Patent
Pardo et al.

(10) Patent No.: US 9,514,085 B2
(45) Date of Patent: Dec. 6, 2016

(54) METHOD AND APPARATUS FOR HIGH BANDWIDTH DICTIONARY COMPRESSION TECHNIQUE USING SET UPDATE DICTIONARY UPDATE POLICY

(75) Inventors: Ilan Pardo, Ramat Hasharon (IL); Ido Y. Soffair, Tel-Aviv (IL); Dror Reif, Be'er-Yacoov (IL); Debendra Das Sharma, Saratoga, CA (US); Akshay G. Pethe, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 893 days.

(21) Appl. No.: 13/638,132

(22) PCT Filed: Oct. 1, 2011

(86) PCT No.: PCT/US2011/054486
§ 371 (c)(1),
(2), (4) Date: Sep. 28, 2012

(87) PCT Pub. No.: WO2013/048530
PCT Pub. Date: Apr. 4, 2013

(65) Prior Publication Data
US 2013/0205055 A1    Aug. 8, 2013

(51) Int. Cl.
G06F 13/42 (2006.01)
H03M 7/00 (2006.01)
(Continued)

(52) U.S. Cl.
CPC ............ *G06F 13/42* (2013.01); *H03M 7/3088* (2013.01); *G06F 13/00* (2013.01); *H03M 7/00* (2013.01)

(58) Field of Classification Search
CPC .......... G06F 13/42; G06F 12/12; G06F 13/00; H03M 7/00; H03M 7/3059
(Continued)

(56) References Cited

U.S. PATENT DOCUMENTS 5,485,526 A * 1/1996 Tobin ............................ 382/232
7,507,897 B2   3/2009 Ho
(Continued)

FOREIGN PATENT DOCUMENTS

WO       97/09665 A2    3/1997
WO    2013/048530 A1    4/2013
(Continued)

OTHER PUBLICATIONS

Pomeranz et al, On the Generation of Small Dictionary for Fault Location, 1994, University of Iowa.*
(Continued)

*Primary Examiner* — Henry Tsai
*Assistant Examiner* — Christopher A Daley
(74) *Attorney, Agent, or Firm* — Law Office of R. Alan Burnett, P.S

(57) ABSTRACT

Method, apparatus, and systems employing novel dictionary entry replacement schemes for dictionary-based high-bandwidth lossless compression. A pair of dictionaries having entries that are synchronized and encoded to support compression and decompression operations are implemented via logic at a compressor and decompressor. The compressor/decompressor logic operatives in a cooperative manner, including implementing the same dictionary update schemes, resulting in the data in the respective dictionaries being synchronized. The dictionaries are also configured with replaceable entries, and replacement policies are implemented based on matching bytes of data within sets of data being transferred over the link. Various schemes are disclosed for entry replacement, as well as a delayed dictionary update technique. The techniques support line-speed compression and decompression using parallel operations resulting in substantially no latency overhead.

20 Claims, 10 Drawing Sheets

(51) Int. Cl.
*H03M 7/30* (2006.01)
*G06F 13/00* (2006.01)

(58) Field of Classification Search
USPC .................................. 710/105, 106; 341/87
See application file for complete search history.

(56) References Cited

U.S. PATENT DOCUMENTS

| | | |
|---|---|---|
| 2002/0029206 A1 | 3/2002 | Satoh et al. |
| 2002/0101367 A1* | 8/2002 | Geiger et al. .................... 341/51 |
| 2008/0071818 A1 | 3/2008 | Apanowicz et al. |
| 2010/0125448 A1* | 5/2010 | Goswami .............. G06F 17/275 704/8 |
| 2010/0127902 A1* | 5/2010 | Schneider ........................ 341/51 |
| 2010/0223237 A1* | 9/2010 | Mishra et al. ................. 707/693 |
| 2013/0082851 A1 | 4/2013 | Pardo et al. |
| 2013/0086339 A1 | 4/2013 | Pardo et al. |
| 2013/0290615 A1* | 10/2013 | Shah .............................. 711/103 |
| 2013/0297879 A1* | 11/2013 | Abali et al. ................... 711/128 |
| 2013/0332146 A1* | 12/2013 | Agarwal et al. ................ 704/10 |

FOREIGN PATENT DOCUMENTS

| | | |
|---|---|---|
| WO | 2013048529 A1 | 4/2013 |
| WO | 2013048531 A1 | 4/2013 |

OTHER PUBLICATIONS

International Search Report and Written Opinion Received for PCT Patent Application No. PCT/US2011/054485, Mailed on May 11, 2012, 8 pages.

International Search Report and Written Opinion Received for PCT Patent Application No. PCT/US2011/054486 , Mailed on May 16, 2012, 8 pages.

International Preliminary Report on Patentability and Written Opinion received for PCT Patent Application No. PCT/US2011/054485, mailed on Apr. 10, 2014, 5 pages.

International Preliminary Report on Patentability and Written Opinion received for PCT Patent Application No. PCT/US2011/054486, mailed on Apr. 10, 2014, 5 pages.

* cited by examiner

| Match bit | Type / 1st Data [7:4] | Type / 1st Data [3:0] | Format | Data n bytes |
|---|---|---|---|---|
| 0 | Data byte 0 [7:4] | Data byte 0 [3:0] | No match | Data byte 1<br>Data byte 2<br>Data byte 3 |
| 1 | 0xF – 1111 | Dictionary Index | 4 byte match (mmmm) | - |
| 1 | 0x7 – 0111 | Dictionary Index | 3 byte match (xmmm) | Data byte 3 |
| 1 | 0xB – 1011 | Dictionary Index | 3 byte match (mxmm) | Data byte 2 |
| 1 | 0xD – 1101 | Dictionary Index | 3 byte match (mmxm) | Data byte 1 |
| 1 | 0xE – 1110 | Dictionary Index | 3 byte match (mmmx) | Data byte 0 |
| 1 | 0x3 – 0011 | Dictionary Index | 2 byte match (xxmm) | Data byte 2<br>Data byte 3 |
| 1 | 0xC – 1100 | Dictionary Index | 2 byte match (mmxx) | Data byte 0<br>Data byte 1 |
| 1 | 0x9 – 1001 | Dictionary Index | 2 byte match (mxxm) | Data byte 1<br>Data byte 2 |
| 1 | 0x6 – 0110 | Dictionary Index | 2 byte match (xmmx) | Data byte 0<br>Data byte 3 |
| 1 | 0xA – 1010 | Dictionary Index | 2 byte match (mxmx) | Data byte 0<br>Data byte 2 |
| 1 | 0x5 – 0101 | Dictionary Index | 2 byte match (xmxm) | Data byte 1<br>Data byte 3 |
| 1 | 0x0 | 0xF – 1111 | 4 zero match (zzzz) | - |
| 1 | 0x0 | 0x7 – 0111 | 3 zero match (xzzz) | Data byte 3 |
| 1 | 0x0 | 0xB – 1011 | 3 zero match (zxzz) | Data byte 2 |
| 1 | 0x0 | 0xD – 1101 | 3 zero match (zzxz) | Data byte 1 |
| 1 | 0x0 | 0xE – 1110 | 3 zero match (zzzx) | Data byte 0 |
| 1 | 0x0 | 0x3 – 0011 | 2 zero match (xxzz) | Data byte 2<br>Data byte 3 |
| 1 | 0x0 | 0xC – 1100 | 2 zero match (zzxx) | Data byte 0<br>Data byte 1 |
| 1 | 0x0 | 0x9 – 1001 | 2 zero match (zxxz) | Data byte 1<br>Data byte 2 |
| 1 | 0x0 | 0x6 – 0110 | 2 zero match (xzzx) | Data byte 0<br>Data byte 3 |
| 1 | 0x0 | 0xA – 1010 | 2 zero match (zxzx) | Data byte 0<br>Data byte 2 |
| 1 | 0x0 | 0x5 – 0101 | 2 zero match (xzxz) | Data byte 1<br>Data byte 3 |
| 1 | 0x0 | 0x0 | No input data | - |
| 1 | 0x0 | 0x1 – 0001 | One byte data, not compared. | Data byte 0 |
| 1 | 0x0 | 0x1 – 0010 | Two bytes data, not compared. | Data byte 0<br>Data byte 1 |
| 1 | 0x0 | 0x1 – 0100 | Three bytes data, not compared. | Data byte 0<br>Data byte 1<br>Data byte 2 |

METHOD AND APPARATUS FOR HIGH BANDWIDTH DICTIONARY COMPRESSION TECHNIQUE USING SET UPDATE DICTIONARY UPDATE POLICY

FIELD OF THE INVENTION

The field of invention relates generally to high-bandwidth compression in computer systems and, more specifically but not exclusively relates to techniques for dictionary update policies for use in dictionary-based high-bandwidth lossless compression.

BACKGROUND INFORMATION

Computer systems typically employ one or more interconnects to facilitate communication between system components, such as between processors and memory. Interconnects and/or expansion interfaces may also be used to support built-in and add on devices, such as IO (input/output) devices and expansion cards and the like. For many years after the personal computer was introduced, the primary form of interconnect was a parallel bus. Parallel bus structures were used for both internal data transfers and expansion buses, such as ISA (Industry Standard Architecture), MCA (Micro Channel Architecture), EISA (Extended Industry Standard Architecture) and VESA Local Bus. In the early 1990's Intel Corporation introduced the PCI (Peripheral Component Interconnect) computer bus. PCI improved on earlier bus technologies by not only increasing the bus speed, but also introducing automatic configuration and transaction-based data transfers using shared address and data lines.

As time progressed, computer processor clock rates where increasing at a faster pace than parallel bus clock rates. As a result, computer workloads were often limited by interconnect bottlenecks rather than processor speed. Although parallel buses support the transfer of a large amount of data (e.g., 32 or even 64 bits under PCI-X) with each cycle, their clock rates are limited by timing skew considerations, leading to a practical limit to maximum bus speed. To overcome this problem, high-speed serial interconnects were developed. Examples of early serial interconnects include Serial ATA, USB (Universal Serial Bus), FireWire, and RapidIO.

Another standard serial interconnect that is widely used is PCI Express, also called PCIe, which was introduced in 2004 under the PCIe 1.0 standard. PCIe was designed to replace older PCI and PCI-X standards, while providing legacy support. PCIe employs point-to-point serial links rather than a shared parallel bus architecture. Each link supports a point-to-point communication channel between two PCIe ports using one or more lanes, with each lane comprising a bi-directional serial link. The lanes are physically routed using a crossbar switch architecture, which supports communication between multiple devices at the same time. As a result of its inherent advantages, PCIe has replaced PCI as the most prevalent interconnect in today's personal computers. PCIe is an industry standard managed by the PCI-SIG (Special Interest Group). As such, PCIe pads are available from many ASIC and silicon vendors.

Processors and memory continue on a course in accordance with Moore's law, albeit recent processor speed increases are based primarily on having multiple cores rather than on increases in clock rate. However, the rate of interconnect speeds, particularly for serial links such as PCIe, have not been able to keep up. This is due in part to finite limits on clock rates in view of current technologies.

Accordingly, rather than focus on increasing speed based on higher clock rates, other schemes have been recently introduced or proposed. For example, the PCIe 3.0 specification doubles the PCIe 2.x interconnect bandwidth by using a combination of increased clock rate and switching to 8 bit encoding from PCIe's standard 8b/10b encoding (10 bits of encoded data for every 8 bits of usable data).

Another approach for increasing effective link bandwidth is using data compression. There are several viable data compression schemes used for various types of data transfers. However, the overhead and computational requirements associated with many of these schemes make them impractical for use in high-speed serial interconnects such as PCIe. For example, in order to be beneficial the average speed improvement gain must be greater than the average overhead increase due to the compression/decompression operations (in terms of transfer latency). Since the PCIe protocol payload size limit is only 4 KB (and most packet payloads for actual implementations are typically limited to 256 bytes (for server chipsets) and 128 bytes (for client chipsets)), there is generally no benefit (and, in fact there would typically be a detriment) if conventional compression encoding techniques were to be employed on a PCIe link. Accordingly, it would be advantageous to implement a high-bandwidth lossless compression/decompression scheme for high-speed interconnects with no or minimal transfer latency due to processing overhead.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein like reference numerals refer to like parts throughout the various views unless otherwise specified:

FIG. 4 shows a table illustrating an exemplary set of encodings for use in a dictionary-based compression/decompression implementation, according to one embodiment;

DETAILED DESCRIPTION

Embodiments of methods, apparatus and systems employing novel replacement policies for replacement of dictionary entries in connection with implementation of dictionary-based high-bandwidth lossless compression are described herein. In the following description, numerous specific details are set forth (such as exemplary implementations using PCIe) to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

In accordance with aspects of the embodiments disclosed herein, techniques are provided to support high-bandwidth lossless compression using a novel dictionary-based compression/decompression scheme. The techniques can generally be implemented in links and interconnects such as high-speed serial links, as well as implementations supporting high bandwidth lossless data compression. Moreover, the transfer bandwidth improvements are achieved without modification to the underlying link physical transport.

Figure 1:
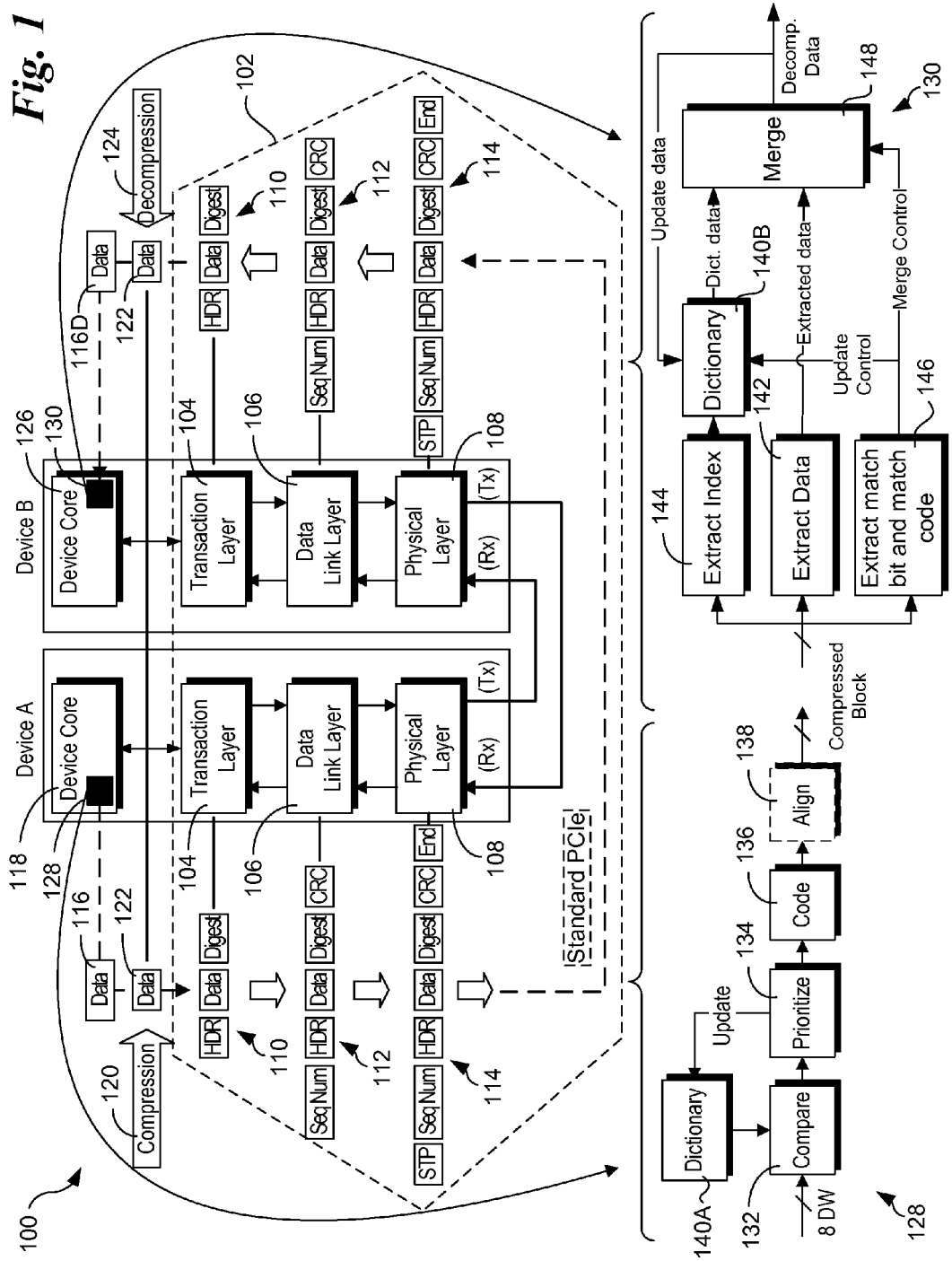
FIG. 1 shows an overview of a high bandwidth lossless compression data transfer architecture using dictionary-based compression and decompression implemented as an augmentation to a standardized PCIe architecture, according to one embodiment.

FIG. 1 shows an overview of a high bandwidth lossless compression data transfer architecture 100 implemented as an augmentation to a standardized PCIe architecture, according to one embodiment. The portion of the diagram depicting blocks and flow logic for implementing the standard PCIe aspects are delineated by a dashed box 102, with the operations and logic corresponding to the augmentation supporting compression and decompression operations comprising the remainder of the diagram.

Under PCIe, data is transferred in a packetized form between two PCIe endpoints or ports, as depicted by a Device A, and a Device B. PCIe links comprise single or multi-lane point-to-point interconnects. Moreover, the point-to-point interconnects are configured in unidirectional point-to-point interconnect pairs in opposing directions such that each link pair supports bi-directional communication. Transfers originate from a sender or transmitter, and are received by a receiver. Data that is being sent is transmitted over a transmit (Tx) path and corresponding data is received over a receive (Rx) path. The two major classes of packets exchanged between PCIe devices are high level Transaction Layer Packets (TLPs), and low-level link maintenance packets called Data Link Layer Packets (DLLPs). Collectively, the various TLPs and DLLPs enable two PCIe devices to perform memory, IO, and configuration space transactions reliably and use messages to initiate power management events, generate interrupts, report errors, etc.

The three lower layers of the PCIe standard include a Transaction Layer, a Data Link Layer, and a Physical (PHY) layer. Accordingly, each of Devices A and B are depicted as including a transaction layer (block) 104, a data link layer (block) 106, and a physical layer (block) 108. An originating device (e.g., Device A in this example), generates data to be sent to a recipient device (e.g., Device B), which is then packetized by the PCIe layers and transmitted over the link. In the context of a PCIe transaction, the originator is called the Requester, and the recipient is called the Completer.

At the Transaction Layer, the data is packetized into one or more packets having a packet format 110 including a Header (HDR), the packet payload data (Data), and a Digest. At the Data Link Layer a Sequence Number (SeqNum) is added to the beginning of the packet, along with a CRC appended to the end to form a packet format 112. The packet format is further augmented at the Physical Layer by adding STP and End control (K) characters to form a packet format 114. The packet is then sent over the link to be processed by the receiver (Device B) using the reverse sequence, eventually yielding the original data.

Under aspects of the embodiments disclosed herein, a compression and decompression scheme is applied to the packet payload data above the Transaction Layer. In one embodiment, the compression and decompression operations are performed in layer 6 (presentation layer) of the Open System Interconnection Reference Model (OSI-RM). By having the compression and decompression operations performed above the Transaction Layer, there is no augmentation to any layer including and below the Transaction Layer. Thus, the compression/decompression scheme may be implemented using standard PCIe libraries and pads. Moreover, similar implementations may be used with other types of serial links without requiring modification to the underlying link structure.

In FIG. 1, data 116 comprises original (non-compressed) data originating from a device core 118 of Device A. The original data is then compressed, as depicted by a compression operation 120 and compressed data 122. Conventional packet processing and transmission operations are then applied by the PCIe facilities for Devices A and B over an applicable PCIe link. Upon conventional processing at the Transaction Layer block 104 of Device B, the packet payload data is initially extracted in its compressed form (compressed data 122), and then decompressed, as depicted by a decompression operation 124, to yield a copy of the original data 116, which is then received by a device core 126 of Device B.

The compression and decompression operations are implemented using a dictionary-based encoding and decoding scheme implemented by respective compressor and decompressor components using compressor logic 128 and decompressor logic 130 in device cores 118 and 126. Block level details of compressor logic 128 and decompressor logic 130 are depicted at the bottom of FIG. 1. As illustrated, compressor logic 128 includes a compare block 132, a prioritize block 134, a code block 136, an align block 138 (which may be optionally used, depending on the implementation), and a dictionary 140A. Meanwhile, decompressor logic 130 includes a dictionary 140B, an extract data block 142, an extract index block 144, an extract match bit and match code block 146, and a merge block 148. As will become apparent via the further details of the implementation of compressor/decompressor logic and associated operations below, complimentary operations are performed by the compressor/decompressor logic on related data in synchrony. By using this scheme, the amount of data that needs to be added to effect encoding is reduced. Moreover, the operations can be performed in parallel, enabling the compression/decompression operations to be performed at link speed with substantially no overhead in terms of data transfer latency.

In embodiments herein, a dictionary-based scheme is implemented for performing compression and decompression through the use of encoded/decoded data formats. Although dictionary-based approaches have been previously used, they typically add significant latency (for dictionaries with larger vocabularies) or they support limited line-speed bandwidth that is less than desired for today's high-speed interconnects. Additionally, such existing schemes only process a single portion of data (e.g., a single word or double word) at a time. In contrast, the embodiments herein support high-bandwidth line-speeds with low latency through use of parallel operations.

Figure 2:
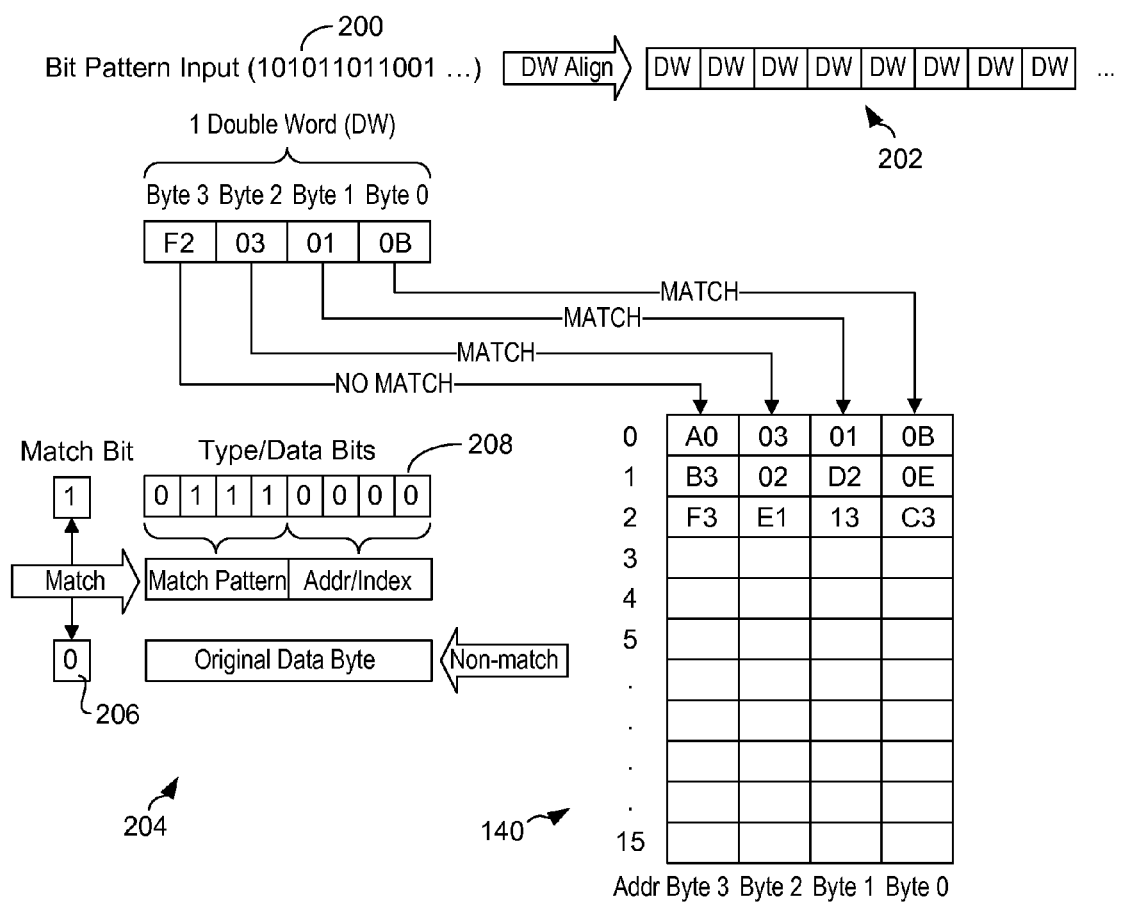
FIG. 2 shows details of selective operations and logic corresponding to one embodiment of a dictionary-based compression/decompression implementation.

Various aspects of the compressor/decompressor logic relating to the use of novel dictionary configuration, encode/decode logic, and dictionary replacement policies are shown in FIGS. 2-7, and 8a-c. For example, FIG. 2 shows an example of a dictionary format and encoding in connection with compression operations on the transmitter side of a transaction employing dictionary-based compression and decompression (on the receiver side). As original data is received as a bit pattern input stream 200, it is partitioned into equal portions of data in an aligned double word (DW) stream 202, with details of the processing of each double word input shown at reference number 204. Each double word comprises 4 bytes, numbered from LSB (Least Significant Byte) to MSB (Most Significant Byte) byte 0, byte 1, byte 2, and byte 3, with each byte comprising 8 bits for a total of 32 bits. In one embodiment, a PCIe link having a width of 16 lanes is used, enabling 16 bits of data to be transported in parallel for each PCIe clock cycle. Optionally, a greater or lesser number of lanes may be used with corresponding packet handling, as would be known to one of skill in the art. Moreover, other types of serial transmission links or interconnects may be implemented in a similar manner.

FIG. 2 further shows one embodiment of a dictionary 140 including 16 rows (i.e., dictionary entries) of 32-bit data, logically divided into four bytes portions. As each double word is received, the data contents of the DW are compared against corresponding byte data in dictionary 140 on a row-wise basis to determine match/non-match conditions. That is, for a given row, the byte 0 values are compared, the byte 1 values are compared, the byte 2 values are compared, and the byte 3 values are compared. The result of the comparison operation is encoded as a match bit 206 and a set of 8 Type/Data bits 208. The match bit 206 indicates whether a match exists. In one embodiment, a match exists if two or more byte values match. A value of '1' identifies a match, while a value of '0' identifies a non-match or miss. If a match exists, the first four bits (from left to right) [7:4] are encoded as a match pattern corresponding to the byte-wise comparison results. Meanwhile, the second four bits [3:0] are encoded as the index (i.e., address) of the matching row in dictionary 140. Accordingly, in the illustrated example, the match pattern is '0 1 1 1' and the matching row index is '0 0 0 0' corresponding to the first row. If the compare operation yields a no-match result (i.e., a dictionary miss), match bit 206 is encoded as a '0', and Type/Data bits 208 are simply encoded as the first byte (LSB or byte 0) of the DW data. Further details of the structure and encoding logic for Type/Data bits 208 are shown FIG. 3 and in a Table 400 of FIG. 4.

Figure 3:
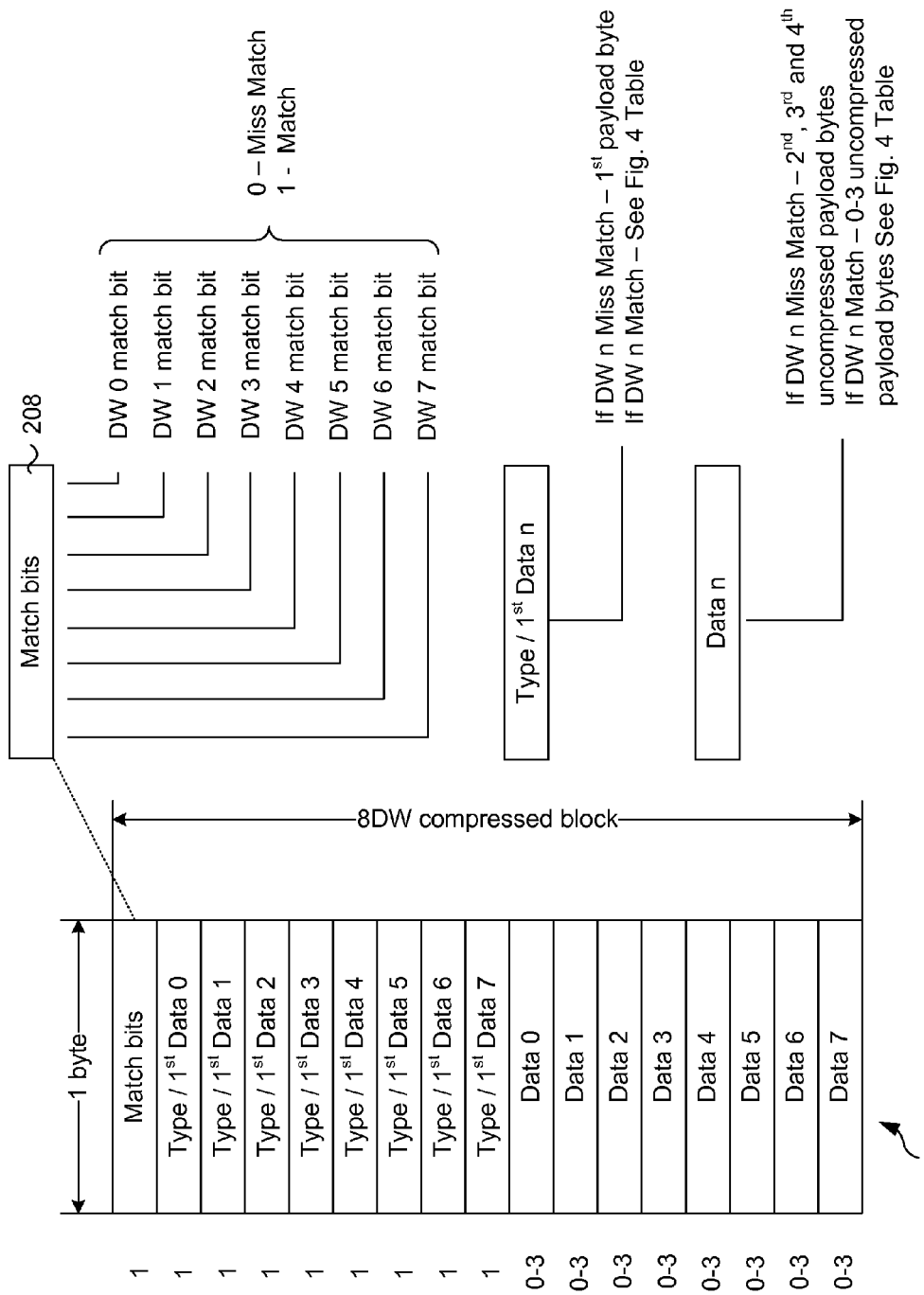
FIG. 3 shows details of an exemplary compressed block encoding scheme, according to one embodiment.

FIG. 3 shows details of an exemplary compressed block encoding scheme, according to one embodiment. One aspect of embodiments disclosed herein is the ability to process multiple portions of data in parallel, thereby dramatically reducing latency associated with the compression/decompression operations. For example, the embodiment illustrated in FIG. 3 show an encoding scheme for processing 8 double words in parallel. Original data in a data stream (e.g., bit pattern input stream 200), is partitioned into an aligned double word stream 202, with 8 DW's being compressed/decompressed in parallel. The encoded form of the 8 DW's is depicted as an 8DW compressed block 300.

The first byte of 8DW compressed block 300 occupies a first slot of the compressed block and comprises the Type/Data bits 208 for the 8 double words, one bit for each DW indicating whether there is a match ('1') or a miss ('0'). The next eight slots comprise respective Type/Data bits 208 entries, one byte for each DW. In one embodiment rules for encoding the Type/Data bits 208 are stored in a table comprising a data structure or the like, such as exemplified by Table 400 of FIG. 4. In response to a match determination, a corresponding row in the table is identified and an encoding format defined by the row data is used to encode the eight bits that are to be encoded. In the case of a dictionary match, the first four bits will be encoded as the match pattern, and the next four bits will comprise the dictionary index. If there is a miss, the 8 bits will correspond to the LSB (byte 0) of the DW. Additional possible encodings that may also apply to a miss of the replaceable dictionary entries are discussed below.

The remaining portion of the 8DW compressed data block 300 comprises variable length slots for storing 0-3 bytes for each of the DW's, with the number of bytes used for a given DW and slot depending on the match condition. For example, for a match of two bytes, the corresponding Data n (0-7) slot will comprise the two bytes that did not match. If there is a match of three bytes, the Data n data will comprise the remaining non-matching byte. For a match of four byes, the Data n data will be null (no data). Meanwhile, for misses, the Data n data will comprise byte 1, byte 2, and byte 3. Accordingly, in combination with the byte 0 data (in the corresponding Type/Data bits 208 slot), the full data of a DW having a miss in encoded in 8DW compressed data block 300 as uncompressed data (effectively).

Figure 5:
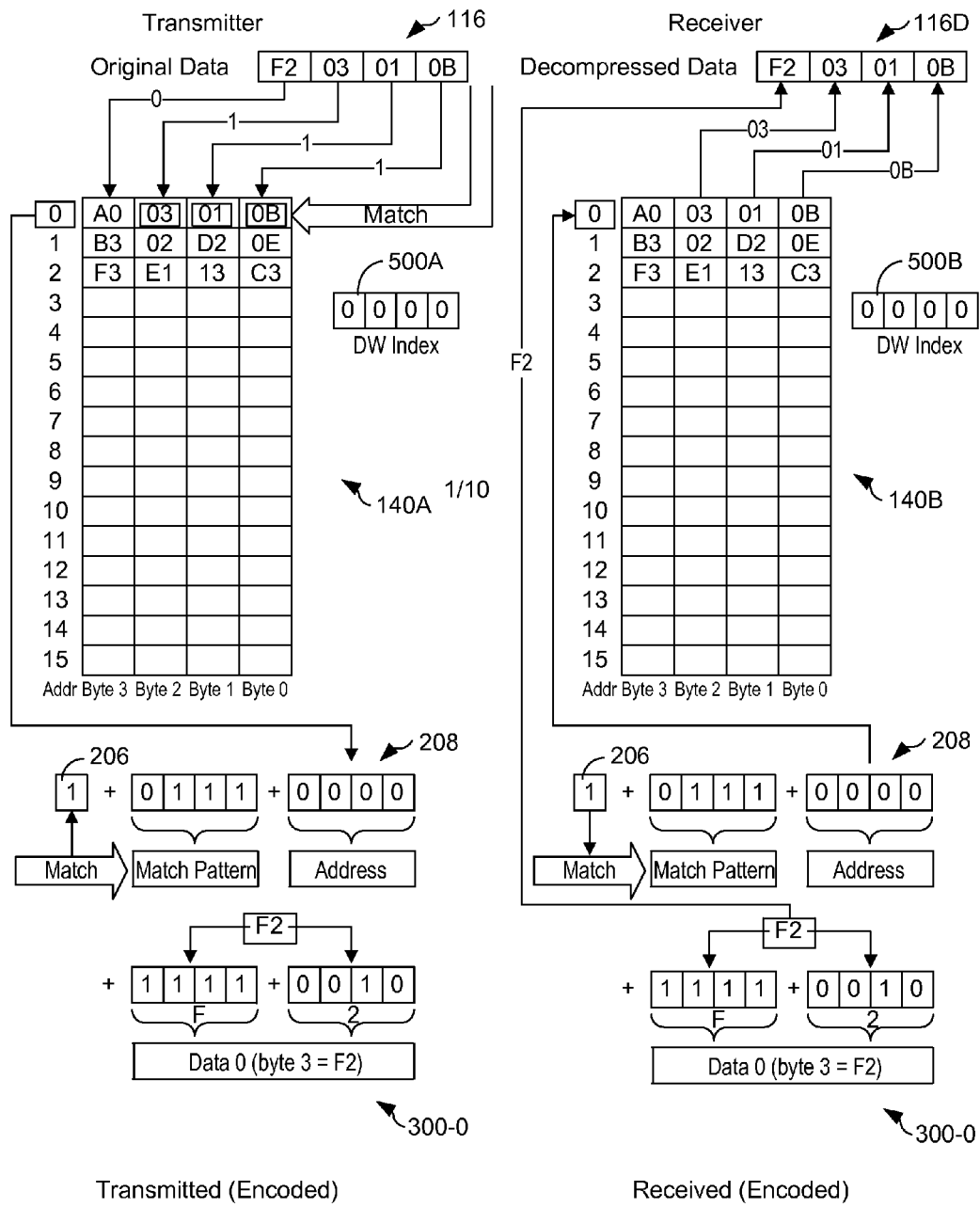
FIG. 5 is a combination block schematic and flow diagram illustrating operations associated with a dictionary match, according to one embodiment.

FIG. 5 shows a combination block schematic/logic flow diagram illustrating operations corresponding to a dictionary match. It is noted that this example and the example in FIG. 6 correspond to processing of a single DW, with processing associated with eight DW's in parallel through use of an 8DW compressed block shown in FIG. 7. It is presumed at this point that dictionary 140 has a full set of sixteen 32-bit entries, but for simplicity only the top three rows are shown populated with data.

Figure 6:
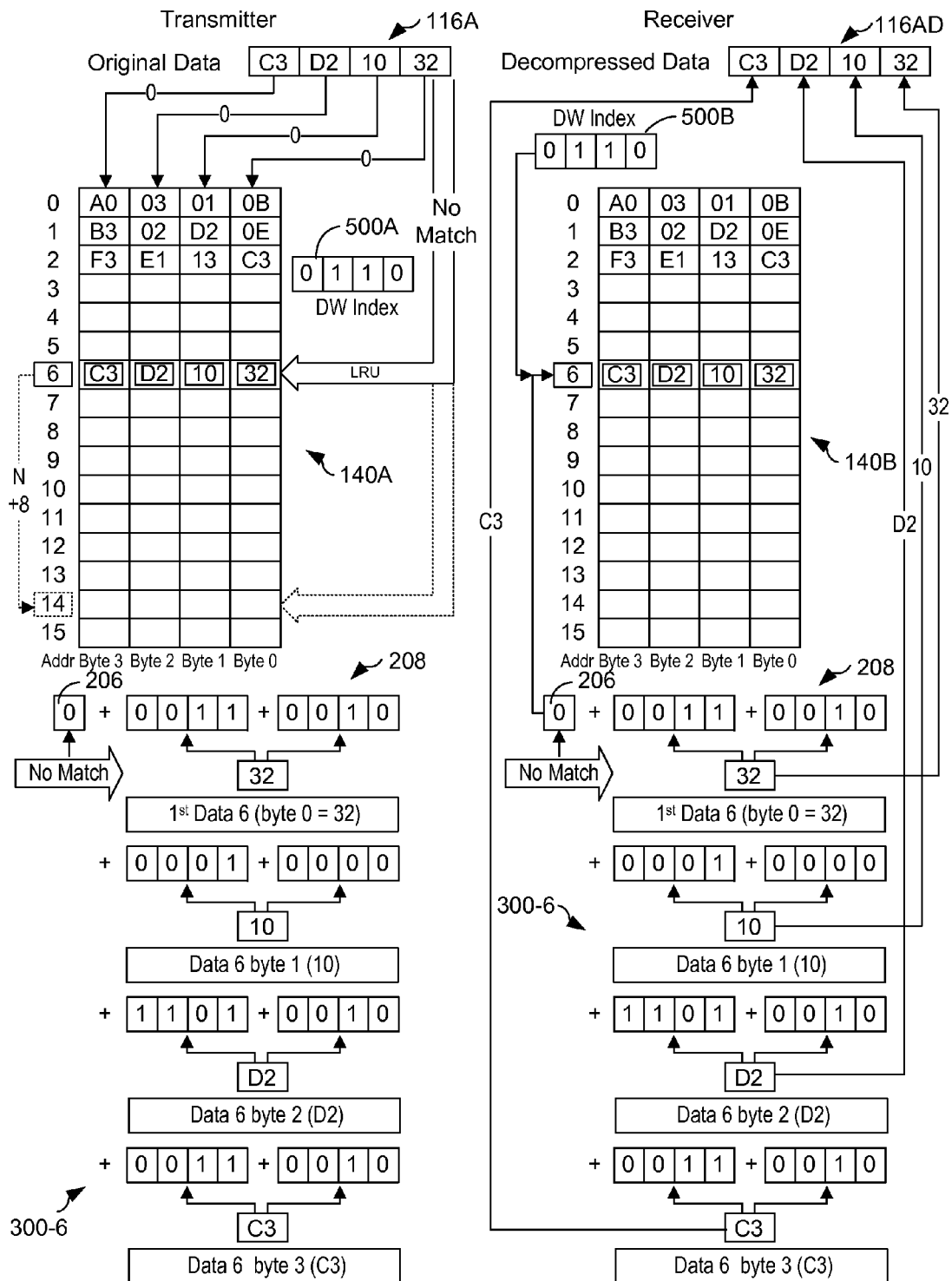
FIG. 6 is a combination block schematic and flow diagram illustrating operations associated with a dictionary miss, according to one embodiment.

For illustration purposes, FIGS. 5 and 6 depict a DW index 500A on the transmitter side and a DW index 500B on the receiver side. The DW indexes are used to designate which individual DW is being processed in the corresponding Figures for better understanding of the techniques. In one embodiment associated with processing eight double words in parallel, the DW indexes are effected through the structure of 8DW compressed block 300 and corresponding programmed logic or the like, such that there is no separate index that is employed.

For the example in FIG. 5, DW indexes 500A and 500B have a value of 0, indicating that original data 116 ('A0 03 23 2C') corresponds to Data 0 in 8DW compressed block 300. As before, the data in each double word is compared with corresponding entries in dictionary 140 on a byte-by-byte basis, looking for the best match, which is defined with the row with the most byte-wise matches (if any). In the case of a tie for best match, the transmitter may select any of the matched (or partially matched) entries as the selected one. In one embodiment, the dictionary entries are encoded in respective registers that support byte-wise comparison operations in parallel. Accordingly, the entire dictionary can be searched for a match in one clock cycle or a fixed number of clock cycles irrespective of the dictionary size.

As discussed above, the data in the dictionaries of the link endpoints is maintained in synchrony (with a very small delay between sender and receiver dictionaries when entries are updated). This is achieved by employing associated complimentary operations at the transmitter and receiver, such that any update to the transmitter dictionary also get applied to the receiver dictionary. As a result, it is known in advance that any matched row will have the same data values at the same row in the synchronized dictionary at the opposing end-point. Thus, rather than sending the original data, the transmitted data for a match is encoded such that the row for the match is identified, along with the match pattern. The match pattern is then used to identify which bytes are matched, and which ones are not. Based on the match pattern and programmed logic in accordance with table 400 in FIG. 4, the decompressor logic knows how the data is encoded and thus knows how to extract the relevant data bytes to reform the original data.

Returning to FIG. 5, the diagram shows a best match for original data 116 with data in the first row having an address or index of '0' ('0 0 0 0'). It is noted that the use here of matching the first row is for convenience and to not obscure the drawing figure, as any of the rows may yield the best match. Upon identifying the row with the best match, corresponding entry 300-0 data in an 8DW compressed block is generated, beginning with a match bit 206 set to '1', followed by Type/Data bits 208 comprising the match pattern ('0 1 1 1') and row address ('0 0 0 0').

Based on the match pattern '0 1 1 1', the compressor/decompressor logic employs a data encoding scheme based on a corresponding row in Table 400. The matching entry corresponding to the third row is bolded in Table 400 to indicate this row contains the applicable logic for a match pattern of '0 1 1 1' (also shown as 'xmmm', wherein 'x' stands for miss and 'm' stands for match). The table logic indicates that data byte 3 is to be encoded for the Data n bytes (see 8DW compressed block 300 detail in FIG. 3). Data byte 3 is the non-matching byte and has a value of 'F2'. Accordingly, a single byte at the Data 0 slot is encoded with a corresponding binary value '1 1 1 1 0 0 1 0'.

An 8DW compressed block containing entry 300-0 data is transferred as payload data in a PCIe packet to the receiver, where it is decompressed by decompressor logic 130. The receiver has its own copy of the dictionary, labeled dictionary 140B. Upon receipt of the 8DW compressed block, the decompressor logic 130 (see FIG. 1) decodes the compressed data, extracting data as depicted by extract data block 142, also extracting the match bit pattern and match code (block 146). The match bit for each DW is used to determine whether there is a match for that DW. Upon identifying that a match exists for a given DW, dictionary extraction and data merge operations are performed, as depicted by extract index block 144, dictionary 140B and merge block 148. Based on the encoding for a match, the logic knows the first four bits of the Type/1$^{st}$ Data 0 entry identify the match pattern, and the following four bits comprise a dictionary address of the row index corresponding to the matching row. Moreover, based on the match pattern bits '0 1 1 1' the logic is configured to retrieve Byte 0, Byte 1, and Byte 2 from the dictionary entry of the matching row and merge Byte 3 with the single byte of data stored at the corresponding Data n slot (Data 0 in this example, with a value of F2). Thus, the decompressed data 116D, having a value of 'F2 03 01 0B', is identical to original data 116.

Other matching DW values are processed in a similar manner. On the transmitter side, first a match is detected via a dictionary lookup. If a match results, the 8DW compressed block is encoded with the match bit for the corresponding DW index and applicable match pattern bits and row index bits are inserted in the applicable Type/1$^{st}$ Data n slot. Depending on the particular match pattern, the Data n slot is encoded with a copy of the non-matched bytes in a predetermined order. (As discussed above, if all bytes match, the Data n slot will be empty.) On the receiver side, the compressed data is decoded and processing of each DW with a corresponding '1' for its match bit proceeds with a dictionary extraction of the applicable bytes based on the match pattern and row index and merging with 0-2 remaining data bytes in the appropriate Data n slot.

The block schematic/flow diagram of FIG. 6 shows an example of a non-matching case under which an existing dictionary entry is replaced with original data 116A. In this example, original data 116A has a value of 'F2 03 01 0B' with a DW index of '0 1 1 0' (i.e., 6). As depicted, none of Bytes 0-3 match any corresponding entries for Bytes 0-3 in dictionary 140A. However, the definition of a non-match condition generally does not require that all bytes not match (although it could, depending on a particular implementation), but rather requires the number of matching bytes be less than a threshold number of byte matches (in this example the threshold match number is two). Accordingly, if there are less than two byte-wise matches, then a non-match or miss condition occurs. As before, this can be detected by searching the dictionary entries in parallel.

In response to a miss, the logic may be configured to update (i.e., replace) a dictionary entry with corresponding data. This may be advantageous under various situations, such as accessing the same address for memory or IO transactions. By adding data corresponding to the address to the dictionary, when the address or nearby addresses are referenced in a corresponding transaction, data compression may be available.

The logic for adding entries to the dictionary may vary, depending on the particular implementation and targeted use. For example, conventional logic for adding entries to caches, such as FIFO (First-in, First-out) and LRU (Least Recently Used) algorithms may be employed. However, testing and modeling has shown that unrestricted parallel dictionary updates using these types of replacement algorithms may yield sub-optimal results, depending on use context.

Rather than employing a global replacement policy for dictionary entries, one embodiment employs an approach that limits new entries to a subset of the dictionary entries based on corresponding DW sequencing (e.g., the applicable DW index for an 8DW compression block). On a first level, each input double word that is a miss may be written to only a subset of the replaceable dictionary entries. A second level scheme may then be employed to select a particular entry from among the subset of entries, such as FIFO, LRU, or other replacement algorithms.

The proposed approach resembles the well-known set-associative technique used in some cache designs. A miss request may be allocated and written to a subset of the cache locations defined by the cache set. The difference here is twofold. First, the allocation in a set-associative cache is done based on subset of the address bits of the request; here, in one embodiment, the allocation is defined by the text symbol location (in time) within the input stream. Second, since specific data may appear in any text symbol location, to detect a cache hit, each of the input text symbols is compared to all dictionary entries regardless of the allocation. In this sense the compare behaves as fully associative cache while the replacement behaves as set-associative cache. When applied to the dictionary context, the scheme is referred to as an "N-way set allocation" dictionary replacement scheme.

In one embodiment of an N-way set allocation dictionary replacement scheme, a set of replacement dictionary entries are associated with an index for each portion of data in a block, with the index generally referred to herein as a data index to differentiate it from the dictionary index. For example, if each portion of data comprises a double work, the index is the DW index (shown in the Figures herein), and the number of indexes in a block is equal to the number of DWs in the block. Furthermore, in one embodiment the set of replacement dictionary entries for each data index is unique, such that there is no overlap between sets. By configuring the sets in this manner, parallel operations can be performed on all portions of data for a given block in parallel with corresponding dictionary updates being facilitated for any combination of match/miss conditions for the portions of data in the block.

Under this parallel replacement sets embodiment, the replacement sets for an N-way set allocation dictionary replacement policy may be generalized to apply to dictionary replacement policies for various size dictionaries and data blocks, as defined by the following Equation 1, $$U^{k/N-1}_{i=0} j+N*i.$$

wherein U is the union operation, each portion of data has a data index j, the number of portions of data in a block is N (also equal to the number of data indexes and the number of sets), and the number of replaceable dictionary entries in the dictionary is k. For example, if a block is divided into 8 portions of data (i.e., N=8) and the number of replaceable entries in a dictionary (k) is 16, the set of replaceable entries for a data index j would be {j, j+8}, corresponding to an 8-way set allocation with each set comprising two dictionary entries. This result is depicted in the embodiment illustrated in FIG. 6. Other similar replacement schemes could also be implemented using an applicable N-way set allocation, as defined by Equation 1.

In one embodiment, an LRU replacement scheme is used to select the dictionary entries to be replaced on a set-wise basis. For example, for each set, information is stored identifying the least recently used entry for the set. For a set with two members, something as simple as a flip-flop or single logic bit could be used to track the LRU entry. Other well-known LRU schemes could be used for sets having more than two members. In another embodiment, a FIFO scheme is used. Other set replacement schemes may also be used, such as weighted round-robin, pseudo-random, etc.

Returning to FIG. 6, in the illustrated example the set-association is an eight-way set association employing a j+8 replacement policy. The possible entries to be replaced are j, the DW index, and j+8; in this example j=6 and the possible entries are 6 and 14. In the illustrated example, the LRU algorithm identifies row 6 as the applicable row (between possible rows 6 and 14) to replace, and thus the Byte 0-3 data at row 6 is replaced with Byte 0-3 of original data 116A, i.e., the non-matching DW data.

A dictionary miss results in two actions on the transmitter side. First, as just discussed, a dictionary entry is replaced with the non-matching data, as depicted by the update data arrow pointing to dictionary 140A. Second, the entire DW data is transferred uncompressed (in accordance with the 8DW compressed block encoding scheme) to be processed by decompressor logic 130 at the receiver. This is implemented by setting the match bit 206 to 0, copying the Byte 0 value into the appropriate Type/1$^{st}$ Data n slot, and copying Byte 1, Byte 2, and Byte 3 data to the application Data n slot.

As discussed above, dictionaries 140A and 140B are kept synchronized. Accordingly, since the transmit-side dictionary 140A was updated using the DW index value and the DW index data is encoded in the 8DW compressed block, the applicable DW index corresponding to the dictionary entry replacement algorithm is decoded by the receiver, as depicted by extract index block 144. As a result, when the receiver decompressor logic processes the compressed block, exactly the same dictionary updates will be performed at the receiver, thus keeping the dictionary data at the transmitter and receiver synchronized.

As before, the encoded data 300-6 is encoded in an 8DW compressed block that is packetized and sent over the link to the receiver, whereupon it is decompressed in accordance with decompressor logic 130. A '0' value for match bit 206 indicates there will be a dictionary entry replacement, with the Byte 0 of the replacement value stored at the applicable Type/1$^{st}$ Data n slot (in this example Type/1$^{st}$ Data 6 slot), and the Byte 1, Byte 2, and Byte 3 extracted from the applicable Data n slot (Data 6 slot). Accordingly, row 6 is updated with the original data 116A data, which also corresponds to the value of decompressed data 116AD.

Figure 7:
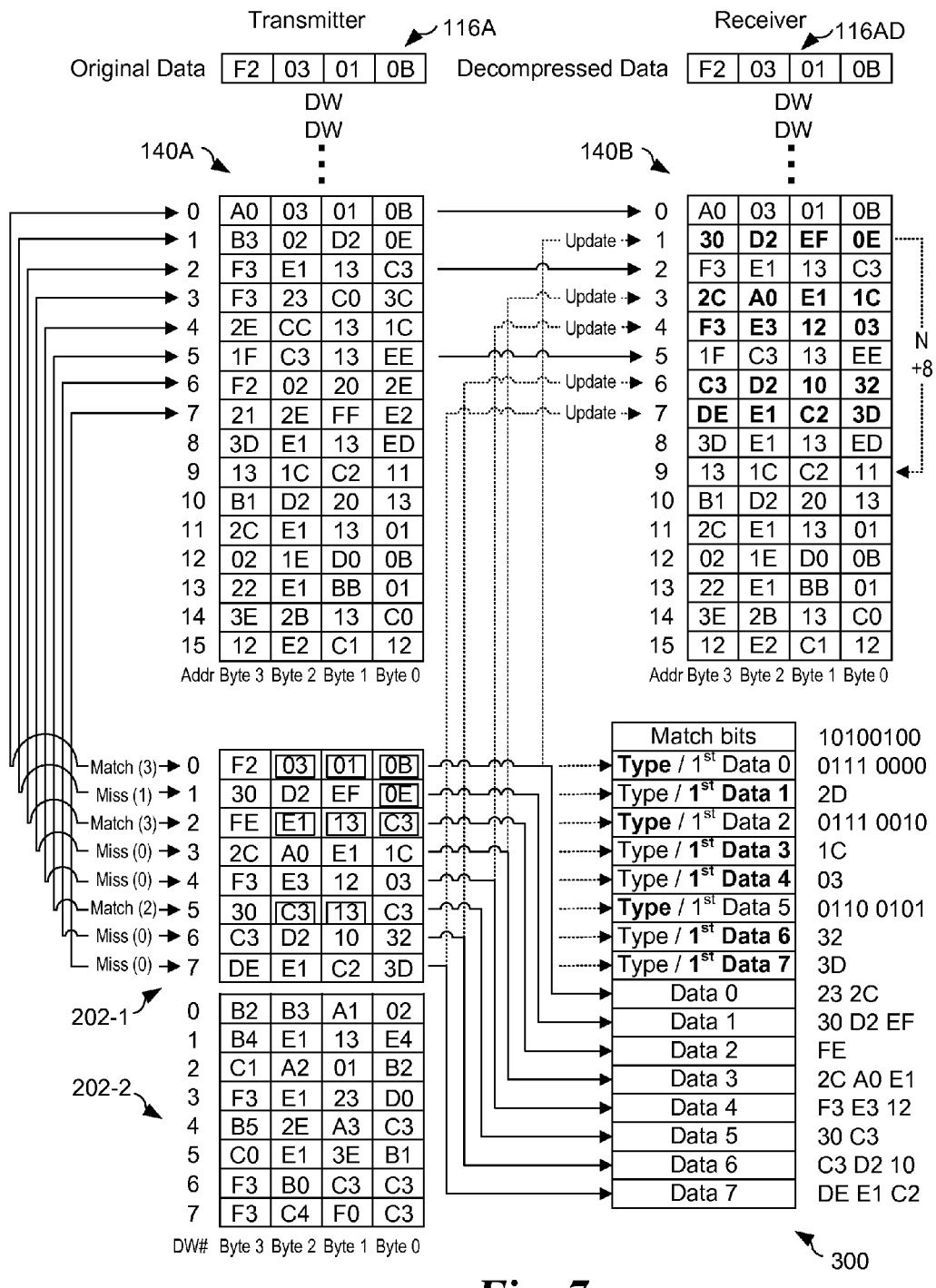
FIG. 7 is a combination block schematic and flow diagram illustrating parallel operations associated with the processing of an 8 double word compressed block.

FIG. 7 shows example input data and dictionary data at various stages of a data transfer operation employing parallel compression/decompression operations and implemented with an 8DW compression block 300. A first set of 8 DW's are received and processed in parallel, as depicted by 8 DW set 202-1. A second set of 8 DW's is depicted as 8 DW set 202-2; these data correspond to the next set of 8 DW's to be processed. Dictionary 140A on the transmitter side is shown in a condition prior to processing 8 DW set 202-1. Meanwhile, dictionary 140B on the receiver side is shown in a condition after processing 8 DW set 201-1, with the updated dictionary entries shown in bold. FIG. 7 further shows various data values adjacent to the slots in 8DW compressed block 300. These include the match bits, and applicable values for each Type/1$^{st}$ Data n slot, as well as data bytes stored in the Data n slots.

As depicted in FIG. 7, matched bytes are shown in framed boxes, and the resulting match bits are '1 0 1 0 0 1 0 0.' As a result, the applicable DW Data n corresponding to dictionary entries that are to be replaced are Data 1, Data 3, Data 4, Data 6, and Data 7. For convenience, the dictionary entries for corresponding rows 1, 3, 4, 6, and 7 are shown as being replaced (updated) in dictionary 140B. However, it shall be recognized that in one embodiment the aforementioned j+8 replacement scheme may be used. As a result, the possible replacement rows are 1 or 9, 3 or 11, 4 or 12, 6 or 14, and 7 or 15, with the applicable row in each set dependent on the set replacement algorithm being used and the applicable prior data usage and/or replacement history (e.g., for LRU). It will be further recognized that the same rows would be replaced in dictionary 140A (replacement not shown).

In addition to having replaceable dictionary entries, a dictionary may include fixed (i.e., predefined) entries or otherwise applicable rules may be implemented via embedded logic or other means to support similar operations. For example, a portion of the encoded formatting of data in Table 400 of FIG. 4 corresponds to rules for data values containing one or more bytes having a value of 0. As defined by the column with the heading "Type/1$^{st}$ Data [7:4] data," an encoding of 0×0 (i.e., '0 0 0 0') is defined for data containing two or more bytes with a value of zero. The corresponding match pattern is defined in the "Format" column. Additionally, the last four entries in Table 400 correspond to respective situations where there is no input data, or one, two, or three bytes of input data that is not compared. In each of the latter three instances, the rules specify a copy of the original data is transferred via the Data n bytes portion of 8DW Compressed block 300.

In accordance with other embodiments of the dictionary update operation, a delay is implemented between dictionary updates under which either the entire replaceable entries in the dictionary are replaced or a subset of the replaceable entries is replaced. For example, in one embodiment operations are performed in a manner similar to above, but rather than update a dictionary entry on a miss, a corresponding replacement entry is added to a temporal "replacement" copy of the dictionary (referred to as a delayed update dictionary) at the transmitter while leaving the original dictionary data unchanged at both the transmitter and receiver. Also as before, a copy of the data is sent in its original form to the receiver, where it is extracted. After a predefined delay, such as M cycles, the updated entries in the delayed update dictionary are copied into the "active" dictionary at the transmitter, and copies of the entries are transmitted to the receiver such that both dictionaries are updated with an applicable set of updated entries. In one embodiment, delayed dictionary updates are done using one or more 8DW compressed blocks (or other size DW compressed blocks), under which each Data n entry is encoded as a miss, with the update to the dictionary entries being processed in the manner described above for misses. In addition, in one embodiment copying of dictionary entries from the delayed update dictionary to the dictionary copies at both the transmitter and receiver is initiated synchronously. In another embodiment, each of the transmitter and receiver maintain respective copies of the delayed update dictionary using the same replacement logic at both endpoints.

There are several possible variations to this approach. First, a variety of different replacement algorithms may be employed to replace the dictionary entries that are temporarily stored in the delayed update dictionary, including FIFO, LRU, weighted round-robin, pseudo random, etc. These may be implemented using either a fully-associative or the set-associative replacement scheme discussed above. In addition, the timing or invocation of the delayed dictionary update operation may be implemented under various schemes. For example, a timer, such as a simple counter, may be used to initiate the delayed dictionary update after a predetermined period of time, such as the M cycles discussed above. Optionally, a count could be maintained monitoring the number of updated rows in the delayed update copy of the dictionary. Once the number has reached a threshold, the delayed update could be initiated. In general, the threshold could correspond to the entire number of replaceable rows in the dictionary, or a portion thereof.

Figure 8A:
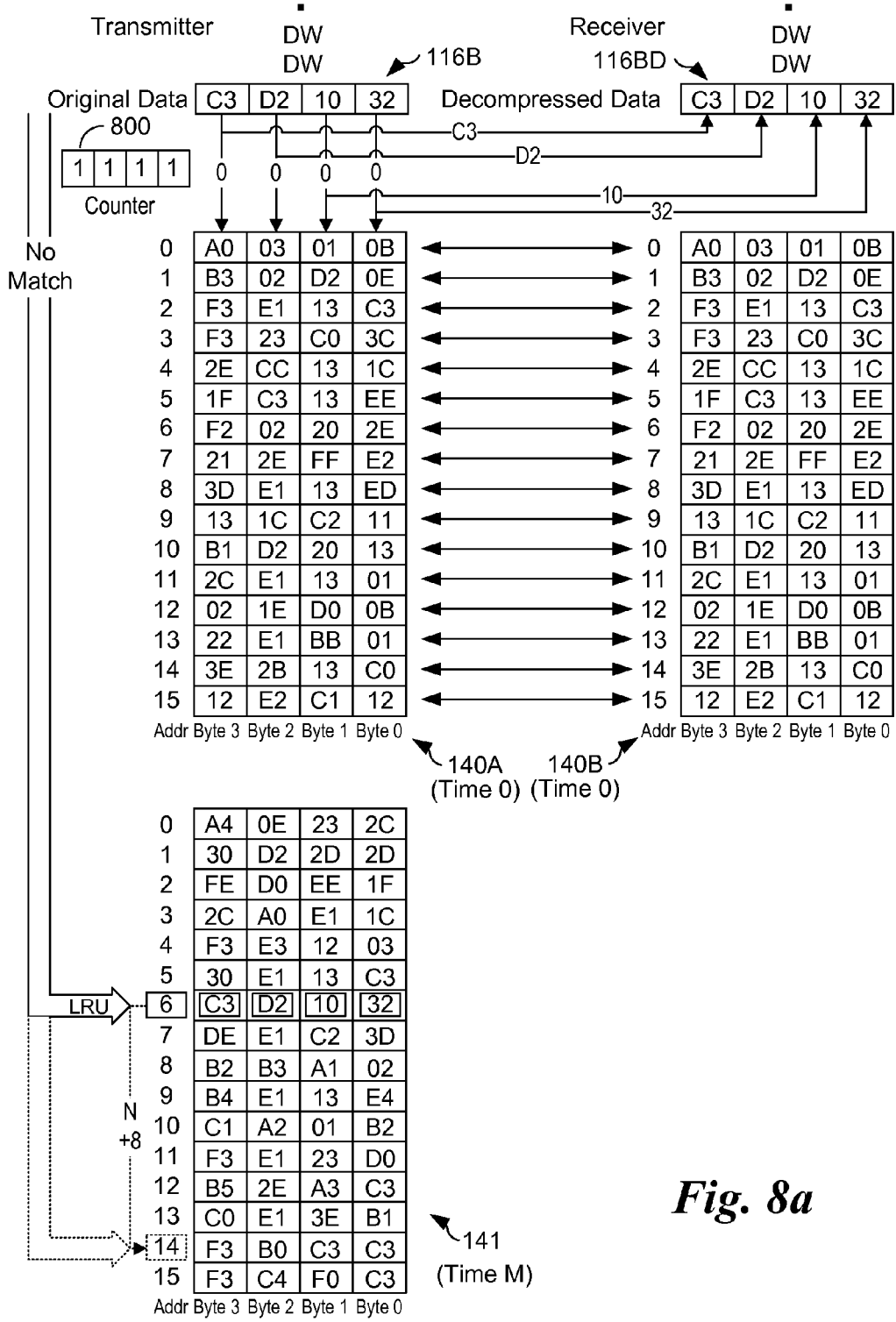
FIGS. 8a and 8b are combination block schematic and flow diagrams illustrating operations performed in connection with a delayed dictionary update, according to one embodiment.
Figure 8B:
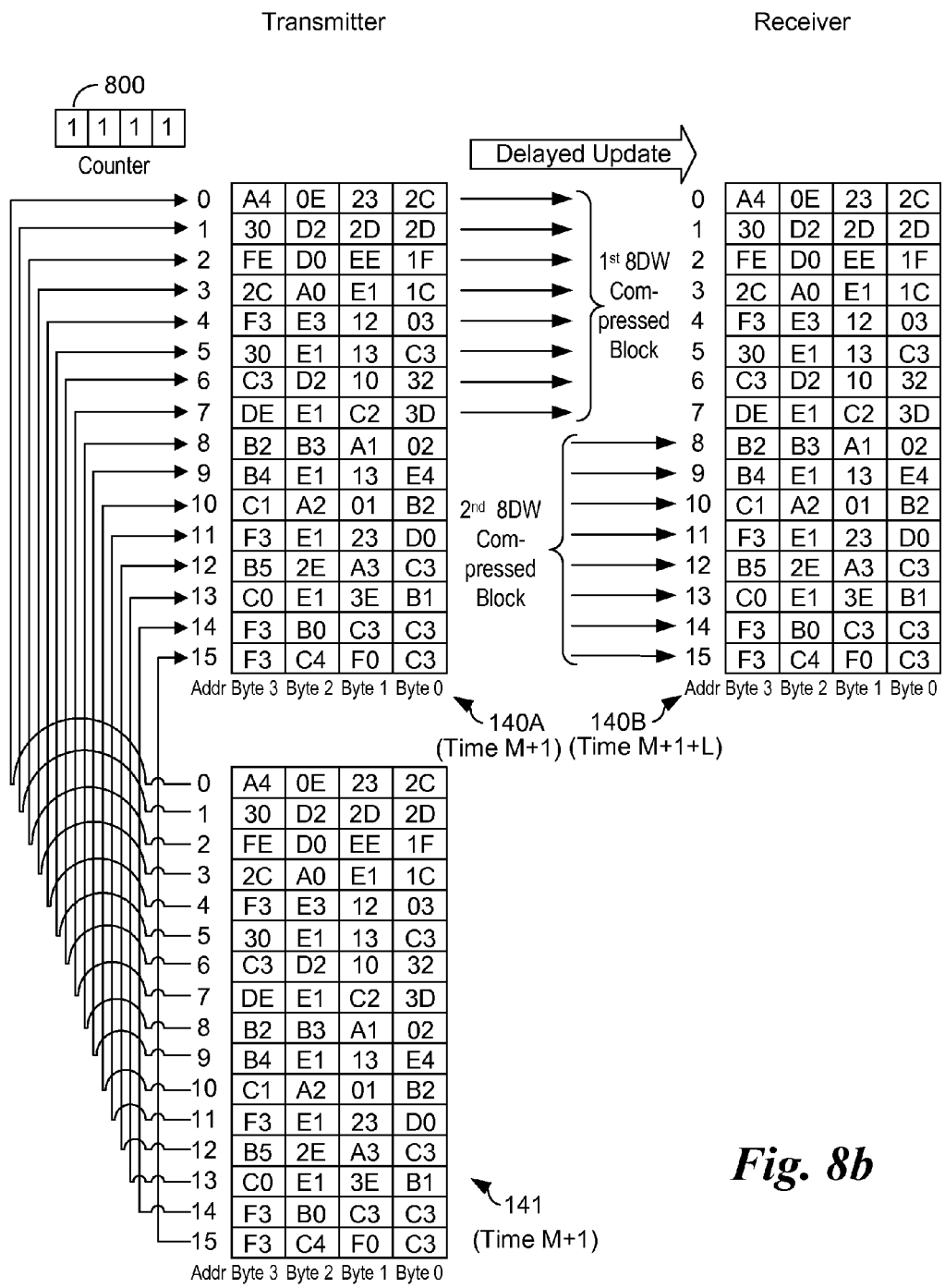

Various aspects of the foregoing discussion are illustrated in FIGS. 8*a* and 8*b*. FIG. 8*a* illustrates operations performed in response to a dictionary miss for a single Data n entry, recognizing that miss operations corresponding to match results for multiple Data n entries in a DW compressed block would be performed synchronously. As before, the data in dictionaries 140A and 140B are identical, and, outside of the dictionary update aspects, data transfers for both misses and matches are handled in the manner discussed above with reference to FIGS. 5 and 6. FIG. 8*a* also shows a delayed update dictionary 141, which would initially contain the same data as dictionaries 140A and 140B immediately after a delayed dictionary update operation. To illustrate this state, both dictionaries 140A and 140B are show at a time 0, which represents the time at completion of a most recent delayed dictionary update operation.

During ongoing operations, misses will occur. In response to each miss, a corresponding row entry will be updated (i.e., replaced) in delayed update dictionary 141, as depicted in FIG. 8*a*, but not updated in either transmitter dictionary 140A or receiver dictionary 140B. Although this shows an example of the set-associative replacement policy presented above, this is merely exemplary, as other types of replacement policies and associated replacement algorithms may be used.

The time indicated for the view of delayed update dictionary 141 is Time M, which may be indicative of M cycles since the last delayed dictionary update, or M may represent a time period since the last delayed dictionary update. In one embodiment, detection of the occurrence of the M cycles or a time period may be implemented using a counter 800.

At Time M, a delayed dictionary update is initiated, as depicted in FIG. 8*b*. First, dictionary 140A is updated with the data from delayed update dictionary 141, as depicted at a time M+1. In one embodiment, the contents of the dictionary are updated in parallel during a single cycle. This may be accomplished, for example, by storing each dictionary row data in a register with an adjacent register for each row used for the delayed update dictionary data for the row, wherein the adjacent registers collectively comprise the delayed update dictionary. Other known data mirroring schemes may also be used. It is further noted that the size of a delayed update dictionary only needs to correspond to the maximum number of rows that are to be replaced with each update (which will typically be equal to the number of replaceable rows in a dictionary, but could be less).

At this point, or initiated concurrently with the update of dictionary 140, a copy of each row (or applicable rows for partial dictionary updates) is transferred to update dictionary 140B at the receiver over the communications link. For example, in one embodiment replacing all sixteen dictionary entries, rows 0-7 in shadow dictionary 141 are sent in a first 8DW compressed block and rows 8-15 are sent in a second 8DW compressed block, with Data n for each compressed block encoded as a miss. Optionally, other schemes may be used for transferring a copy of delayed update dictionary 141 to receiver dictionary 140B. At the completion of a delayed dictionary update operation, the data in dictionary 140B again matches the data in dictionary 140A. This time is depicted as Time M+1+L, with 'L' representing the latency for performing the dictionary data copy transfer.

Figure 8C:
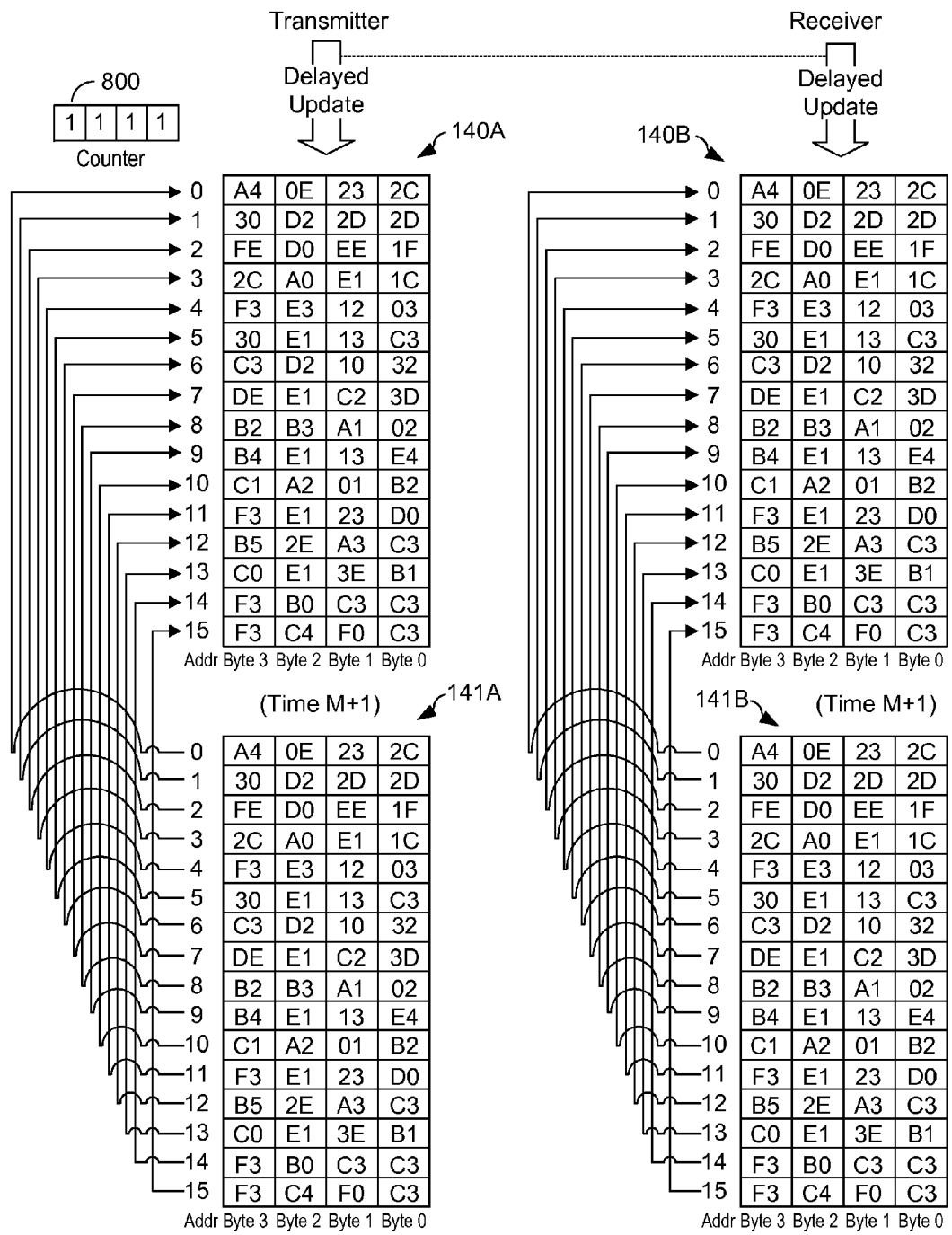
FIG. 8c is a combination block schematic and flow diagram illustrating a delayed dictionary update under which shadow dictionary copies are employed at both a transmitter and a receiver.

FIG. 8*c* depicts an alternative embodiment of the delayed dictionary update. In this embodiment a respective delayed update dictionary 141A and 141B is implemented at both the transmitter and the receiver. Accordingly, to perform a delayed dictionary update the delayed update dictionary data are copied to respective dictionaries 140*a* and 140*b* in a synchronized manner, thus providing a synchronized update of both dictionaries. This may be implemented by effecting a mode switch at the receiver so the decompressor logic may be switched to a delayed dictionary update mode under which dictionary replacement entries are entered into the receiver's delayed update dictionary rather than its active dictionary. In one embodiment, the encoding of an 8DW compressed block remains the same as described above, and processing at the receiver side is the same as before except for the dictionary update aspect when processing an encoded miss.

Through the use of parallel operations, the compression/decompression operations can be performed in real-time at line-speeds and transfer bandwidths that were previously not possible under PCIe. For example, in one embodiment an ×16 (i.e., 16 lane) PCIe link employing the PCIe 3.0 line speed of 8GT/s is implemented. To support a sustained transfer rate of 8GT/s, 8DW (256 bits) of uncompressed data would need to be processed at a clock rate of 1 GHz. The decompressor logic in embodiments discussed above is capable of processing 4DW of compressed data at a 1 GHz clock rate. Thus, if the average compression ratio obtained via use of the compression/decompression scheme is 2×, (meaning on average that 8DW of uncompressed data are compressed into 4DW), the 8GT/s line-speed can be obtained.

Generally, aspects of the embodiments disclosed herein may be implemented as stand-alone components, in systems comprising discreet components, and/or in integrated components and systems, such as a System on a Chip (SoC). For example, peripheral devices employing high-speed serial interfaces may be configured to support compression/decompression operations when operating as a transmitter and/or receiver. Similarly, PCIe or other serial-link end-points within a system employing discreet components, such as a personal computer or server that uses high-speed interfaces to support communication between a processor or IO hub and a peripheral component or controller chip (e.g., graphics controller or GPU) may be configured to support compression/decompression operations when operating as a transmitter and/or receiver. Similarly, SoC's may be configured with high-speed serial links that are used to transfer data between functional blocks on the SoC. In other implementations, logic comprising a compressor or decompressor may be embedded in a functional block of an SoC to operate as one endpoint, while the other endpoint is implemented in a component external to the SoC that is linked to the functional block in the SoC via a serial interconnect or serial link.

Although described above in the context of using the dictionary-based compression/decompression scheme for transport of data over a link, this is not meant to be limiting. Generally, the techniques herein may be used for any application employing high-bandwidth lossless data compression.

The use of the dictionary-based compression/decompression techniques disclosed herein may generally be advantageous when compressing data or data streams that support repetitive and/or predictable data or data sequences. For example, memory and IO transactions that access blocks of memory or data may employ the same or similar addresses and the same data request commands (encoded as corresponding data). Since a fair portion of data being transferred from the transaction request side is repeated, these types of transmissions are good candidates for dictionary-based compression/decompression. On the flip side, transmissions involving a high percentage of random data are not good candidates, since the hit rate will generally be poor. As a result the overhead associated with the compression/decompression operations will exceed the bandwidth improvement for the small portion of packets that are compressed when considered on an averaged basis. The choice of dictionary update scheme may also be application- or use-specific. For example, the use of delayed dictionary updates may be applicable to some use cases, while unsuitable for others.

In view of the foregoing, there may be instances where one direction of transmission between serial link end-points employs compression/decompression, while the link in the opposite direction does not. Moreover, in some implementations it may be advantageous to enable and disable compression/decompression across a given link through use of a corresponding encoding technique or other measure. For example, certain types of transactions may have commands that are encoded in a manner that selectively enables or disables the use of compression/decompression operations in connection with corresponding transactions.

The use of 32-bit data formats (e.g., for the dictionary entries) in the embodiments herein is exemplary, and not meant to be limiting. However, when implementations employ other data width formats, considerations relating to aspects such as link transfer parameters (e.g., lane width, bandwidth, encoding, etc.), and overhead (including latency, circuit logic complexity and costs) and should be made. Similarly, the use of 16 replaceable dictionary entries is also exemplary. The encoding of compressed data, for example may be augmented to support more dictionary entries, but it should be recognized that such augmentations may generally require modifications to related data structures and logic.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention, as those skilled in the relevant art will recognize.

These modifications can be made to the invention in light of the above detailed description. The terms used in the following claims should not be construed to limit the invention to the specific embodiments disclosed in the specification and the drawings. Rather, the scope of the invention is to be determined entirely by the following claims, which are to be construed in accordance with established doctrines of claim interpretation.

What is claimed is:

1. A method comprising:
   implementing a dictionary-based compression scheme using a dictionary having a plurality of dictionary entries;
   configuring a compressor to compress blocks of original data, each block comprising a plurality of portions of original data, each portion having a respective data index,
   implementing a dictionary entry replacement policy under which each data index is associated with a corresponding replacement set of dictionary entries,
   for each of the plurality of portions of original data in a block,
      performing a dictionary match operation on multiple replacement sets of dictionary entries in parallel to determine whether a match or non-matching condition exists; and
      for a non-matching condition,
      selecting a dictionary entry to replace from among the replacement set of dictionary entries associated with the data index for the portion of original data,
   wherein the dictionary comprises a first dictionary implemented at a transmitter that sends compressed data encoded using the first dictionary to a receiver, the method further comprising maintaining dictionary entries in a second dictionary at the receiver such that the dictionary entries in the first and second dictionaries are synchronized.

2. The method of claim 1, further comprising implementing one of a FIFO (First-in, First-out) or Least Recently Used (LRU) replacement policy to select a dictionary entry from among the replacement set of dictionary entries to replace.

3. The method of claim 1, wherein the dictionary replacement policy comprises an N-way set associative replacement policy.

4. The method of claim 1, further comprising employing the dictionary entry replacement policy to replace dictionary entries corresponding to non-matching conditions for a plurality of portions of data in parallel.

5. The method of claim 1, further comprising employing the dictionary entry replacement policy to replace dictionary entries corresponding to non-matching conditions for all of the plurality of portions of data in a block in parallel.

6. A method comprising:
implementing a dictionary-based compression scheme using a dictionary having a plurality of dictionary entries;
configuring a compressor to compress blocks of original data, each block comprising a plurality of portions of original data, each portion having a respective data index,
implementing a dictionary entry replacement policy under which each data index is associated with a corresponding replacement set of dictionary entries,
for each of the plurality of portions of original data in a block,
performing a dictionary match operation on multiple replacement sets of dictionary entries in parallel to determine whether a match or non-matching condition exists; and
for a non-matching condition,
selecting a dictionary entry to replace from among the replacement set of dictionary entries associated with the data index for the portion of original data,
wherein the dictionary replacement policy comprises an N-way set associative replacement policy, and wherein each portion of original data has a data index j, the number of portions of data in a block is N, and the number of dictionary entries in the dictionary is k, and the dictionary replacement policy defines the replacement set for a given data index to include dictionary indexes having values defined by the equation, $$U_{i=0}^{k/N-1} j+N*i.$$

7. A method comprising:
implementing a dictionary-based compression scheme using a dictionary having a plurality of dictionary entries;
configuring a compressor to compress blocks of original data, each block comprising a plurality of portions of original data, each portion having a respective data index,
implementing a dictionary entry replacement policy under which each data index is associated with a corresponding replacement set of dictionary entries,
for each of the plurality of portions of original data in a block,
performing a dictionary match operation on multiple replacement sets of dictionary entries in parallel to determine whether a match or non-matching condition exists; and
for a non-matching condition,
selecting a dictionary entry to replace from among the replacement set of dictionary entries associated with the data index for the portion of original data,
wherein the dictionary replacement policy comprises an N-way set associative replacement policy, and
wherein the N-way set associate replacement policy is implemented such that dictionary entry replacements corresponding to any combination of non-matching conditions for all of the plurality of portions of original data in a block are processed in parallel.

8. The method of claim 7, wherein the dictionary comprises a first dictionary implemented at a transmitter that sends compressed data encoded using the first dictionary to a receiver, the method further comprising maintaining dictionary entries in a second dictionary at the receiver such that the dictionary entries in the first and second dictionaries are synchronized.

9. A method comprising:
implementing a dictionary-based compression scheme using a dictionary having a plurality of dictionary entries;
configuring a compressor to compress blocks of original data, each block comprising a plurality of portions of original data, each portion having a respective data index,
implementing a dictionary entry replacement policy under which each data index is associated with a corresponding replacement set of dictionary entries,
for each of the plurality of portions of original data in a block,
performing a dictionary match operation on multiple replacement sets of dictionary entries in parallel to determine whether a match or non-matching condition exists; and
for a non-matching condition,
selecting a dictionary entry to replace from among the replacement set of dictionary entries associated with the data index for the portion of original data, wherein each portion of data comprises a double word having four bytes of data, and each dictionary entry comprises four bytes of data, and a matching condition exists if two or more bytes of at least one dictionary entry match corresponding bytes in a double word.

10. A device, comprising:
a compressor having a dictionary with a plurality of replaceable entries and having logic configured to,
compress blocks of original data into compressed data via use of a dictionary-based compression/decompression scheme employing the dictionary, each block of original data comprising a plurality of words of data, each word of data having a respective data index;
implement a dictionary entry replacement policy under which each data index is associated with a corresponding set of replacement dictionary entries;
for each of the plurality of words of data in a block,
performing a dictionary match operation on multiple replacement sets of dictionary entries in parallel to determine whether a match or non-matching condition exists; and
for a dictionary miss,
select a dictionary entry to replace from among the set of replacement dictionary entries associated with the data index of the word of data corresponding to the dictionary miss, wherein the compressor logic is further configured to perform dictionary entry replacement operations for multiple words of data in parallel, wherein the words of data comprise four byte double words.

11. The device of claim 10, wherein the dictionary replacement policy comprises an N-way set associative replacement policy.

12. A device, comprising:
a compressor having a dictionary with a plurality of replaceable entries and having logic configured to,
compress blocks of original data into compressed data via use of a dictionary-based compression/decompression scheme employing the dictionary, each block of original data comprising a plurality of words of data, each word of data having a respective data index;
implement a dictionary entry replacement policy under which each data index is associated with a corresponding set of replacement dictionary entries;
for each of the plurality of words of data in a block,
performing a dictionary match operation on multiple replacement sets of dictionary entries in parallel to determine whether a match or non-matching condition exists; and
for a dictionary miss,
select a dictionary entry to replace from among the set of replacement dictionary entries associated with the data index of the word of data corresponding to the dictionary miss,
wherein the compressor logic is further configured to perform dictionary entry replacement operations for multiple words of data in parallel,
wherein the dictionary replacement policy comprises an N-way set associative replacement policy, and wherein each word of data has a data index j, the number of words of data in a block is N, and the number of dictionary entries in the dictionary is k, and the N-way set associative replacement policy defines the replacement set for a given data index to include dictionary indexes having values defined by the equation, $$U_{i=0}^{k/N-1} j+N*i$$

13. The device of claim 12, wherein the words of data comprise four byte double words.

14. A device, comprising:
a compressor having a dictionary with a plurality of replaceable entries and having logic configured to,
compress blocks of original data into compressed data via use of a dictionary-based compression/decompression scheme employing the dictionary, each block of original data comprising a plurality of words of data, each word of data having a respective data index;
implement a dictionary entry replacement policy under which each data index is associated with a corresponding set of replacement dictionary entries;
for each of the plurality of words of data in a block,
performing a dictionary match operation on multiple replacement sets of dictionary entries in parallel to determine whether a match or non-matching condition exists; and
for a dictionary miss,
select a dictionary entry to replace from among the set of replacement dictionary entries associated with the data index of the word of data corresponding to the dictionary miss,
wherein the compressor logic is further configured to perform dictionary entry replacement operations for multiple words of data in parallel; and
a receiver, including a decompressor having a second dictionary with a plurality of replaceable entries and having logic configured to perform decompression operations on compressed blocks of data received from a transmitter of a second device to extract original data through use of the dictionary-based compression/decompression scheme and the second dictionary.

15. The device of claim 14, wherein the compressor logic is configured to implement the dictionary entry replacement policy for all of the words of data in a block of original data in parallel.

16. A system, comprising:
a compressor having a first dictionary with a plurality of replaceable entries and having logic configured to,
compress blocks of original data into compressed data via use of a dictionary-based compression/decompression scheme employing the first dictionary, each block of original data comprising a plurality of four byte double words, each double word having a respective data index;
implement an N-way set associative dictionary entry replacement policy under which each data index is associated with a corresponding set of N replacement dictionary entries; and
perform parallel dictionary entry replacement operations in accordance with the N-way set associative dictionary entry replacement policy; and
a decompressor having a second dictionary with a plurality of replaceable entries and having logic configured to perform decompression operations on compressed blocks of data received from the transmitter to extract original data through use of the dictionary-based compression/decompression scheme and the second dictionary,
wherein the system is further configured to synchronize replacement of dictionary entries in the first and second dictionaries.

17. The system of claim 16, wherein the compressor logic is further configure to replace a plurality of entries in the first dictionary in parallel and generate a compressed data block with encoded information that identifies the entries that are replaced in the first dictionary and replacement data for each replaced entry, and wherein the decompressor logic is further configured to decode the compressed data block to extract the encoded information and replace the same plurality of entries in the second dictionary with the replacement data for each replaced entry.

18. The system of claim 16, further comprising:
a transmitter, in which the compressor is embedded;
a receiver, in which the decompressor is embedded; and
a serial link, linking the transmitter and the receiver in communication.

19. The system of claim 18, wherein the serial link has a line rate, and the compressor logic and decompressor logic is further configured to perform compression and decompression operations in real time to support an average transfer rate of a stream of original data at the line rate.

20. The system of claim 18, comprising a System on a Chip having the transmitter, receiver, and serial link integrated thereon.

* * * * *